(12) United States Patent
Koch

(10) Patent No.: US 7,876,145 B2
(45) Date of Patent: Jan. 25, 2011

(54) CONTROL SYSTEM ARCHITECTURE FOR QUBITS

(75) Inventor: Roger Hilsen Koch, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 864 days.

(21) Appl. No.: 11/777,339

(22) Filed: Jul. 13, 2007

(65) Prior Publication Data

US 2009/0014714 A1   Jan. 15, 2009

(51) Int. Cl.
   *H03K 17/92* (2006.01)
(52) U.S. Cl. .................. 327/366; 327/527; 327/186
(58) Field of Classification Search ......... 327/185–186, 327/366–367, 527–528; 326/1–5
See application file for complete search history.

(56) References Cited

U.S. PATENT DOCUMENTS 6,310,488 B1 * 10/2001 Hasegawa et al. ............. 326/6

2009/0015317 A1 * 1/2009 DiVincenzo et al. ........ 327/528

* cited by examiner

*Primary Examiner*—An T Luu
(74) *Attorney, Agent, or Firm*—F. Chau & Associates

(57) ABSTRACT

A control system architecture for quantum computing includes an array of qubits, which is divided into a plurality of sub-arrays based on a first direction and a second direction, the second direction intersecting the first direction, a plurality of control lines each coupled to a corresponding sub-array of qubits in the first direction, a plurality of enable/unenable lines each coupled to a corresponding sub-array of qubits in the second direction, a controls signal source that generates a control signal, wherein the control lines are used to apply the control signal commonly to one or more sub-arrays of qubits in the first direction, an enable/unenable signal source that generates a enable signal, wherein the enable/unenable lines are used to apply the enable signal independently to the corresponding sub-array of qubits in the second direction to set a bias point of each qubit of the corresponding sub-array of qubits in the second direction between a first position, in which the qubit is unenabled and not responsive to the control signal, and a second position, in which the qubit is enabled and responsive to the control signal.

20 Claims, 7 Drawing Sheets

CONTROL SYSTEM ARCHITECTURE FOR QUBITS

BACKGROUND OF THE INVENTION

1. Field of the Invention

The present disclosure relates to quantum computing and, more particularly, to a control system architecture for controlling qubits.

2. Description of Related Art

A "quantum computer" is an apparatus for information processing or computation that uses the quantum mechanical state of a physical system to represent the logical state of the apparatus. Quantum computing is an interdisciplinary field of research that seeks to develop technologies that can harness the inherent capacity of quantum systems to do massively parallel processing of information. Considerable research effort has been directed toward developing quantum computers, given that ideal quantum computers have been shown to be capable of carrying out certain information processing tasks more rapidly than ordinary digital (classical) computers and have the potential to efficiently solve problems believed to be intractable on classical computers.

In a classical computer, the logical state of the computer is represented in binary form as a "0" or "1". A classical computer encodes information in a series of bits for computation that are normally manipulated via Boolean logic. In a classical computer, the basic unit of a computation is a logic gate, which performs a logic operation on one or more logic inputs and produces a single logic output. In a quantum computer, the fundamental unit of information is a quantum two-state system, called a "quantum bit" or "qubit". A qubit is the counterpart in quantum computing to the binary digit or bit of classical computing.

A quantum computer exploits the intrinsic parallelism of quantum physics in which the quantum state of a single object can behave as if it exists simultaneously in many possible classical configurations. Unlike classical bits, the qubit can exist not only in a state corresponding to the logical state 0 or 1 but in states corresponding to a superposition of these classical states, with a numerical coefficient representing the probability for each state. Hence, in a sense, the qubit can store the values 0 and 1 simultaneously.

Quantum computing generally involves initializing the states of N qubits, creating controlled entanglements among them, allowing these states to evolve, and reading out the states of the qubits after the evolution. The energy states of a qubit are generally referred to as the basis states of the qubit. A quantum computer uses the basis states of a quantum system, such as the "ground state" and "first excited state" abstracted as "|0>" and "|1>", to perform a quantum computation. N qubits connected together could manipulate exponentially more information than N classical bits, although a hardware implementation of a large-scale quantum computer has not yet been realized.

An element in the search for practical quantum computer designs is finding an improved hardware implementation of the qubit. After successes with few-qubit systems, including demonstration of the Shor factorization algorithm with NMR (Nuclear Magnetic Resonance)-based techniques, existing qubit implementations (such as by NMR) have run into limitations of non-scalability.

Data loss or corruption can occur in a quantum computer due to interaction of qubits with particles in the environment causing changes in the qubit's quantum mechanical state. The tendency of a quantum computer to decay from a given state into an incoherent state as qubits interact, or entangle, with the environment is called "decoherence". If the rate of decoherence is small enough, it may be possible to use quantum error correcting codes to correct errors. However the use of quantum error correcting codes brings with it the cost of an increased number of required qubits.

Like an ordinary classical computer, in a quantum computer, only a fraction of the qubits will be required to operate at any one time. The selection of which logic gates in a classical computer, or which qubits in a quantum computer, to operate at any given stage during an operation or algorithm requires a control system and control system architecture. This same control system must provide timing control for the single and multiple gate operations of the computer. The control system design and specification will depend intimately on the nature of the gates being controlled, be they classical or quantum gates.

To perform computations, a quantum computer using Josephson-junction-based qubits, for example, must operate at temperatures near absolute 0 K (typically 5 mK to 30 mK), and so multiplexing schemes for arrays of qubits are needed that also work at low temperatures. A conventional CMOS or superconducting SFQ (Single Flux Quantum) based multiplexer can operate at such low temperatures, but the heat generated by the multiplexer will be so large as to heat the multiplexer and the qubits beyond the temperature at which the qubits cease to work. Today's quantum computers avoid this issue by having the multiplexer in a room temperature environment and running a number of wires, e.g. 16 wires/qubit, between each one of the qubits working at typically 30 mK and the multiplexer at room temperature. Since the number of qubits currently being demonstrated is limited to 3, the number of wires to the qubits is relatively small and manageable. However, to build a quantum computer capable of solving actual problems, for example, a quantum computer using 1,000,000 qubits, the number of wires running from the qubits working at 30 mK to room temperature becomes unmanageable.

A need exists for improved control methods and control systems for controlling qubits in a quantum computer. There is a need for improved methods of multiplexing signals at the quantum computer operating temperature that do not generate excessive heat and that provide the requisite signal fidelity and addressability to enable operation of a quantum computer.

SUMMARY OF THE INVENTION

According to an exemplary embodiment of the present invention, a control system architecture for quantum computing includes an array of qubits, which is divided into a plurality of sub-arrays based on a first direction and a second direction, the second direction intersecting the first direction, a plurality of control lines each coupled to a corresponding sub-array of qubits in the first direction, a plurality of enable/unenable lines each coupled to a corresponding sub-array of qubits in the second direction, a control signal source that generates a control signal, wherein the control lines are used to apply the control signal commonly to one or more sub-arrays of qubits in the first direction, an enable signal source that generates a enable signal, wherein the enable/unenable lines are used to apply the enable signal independently to the corresponding sub-array of qubits in the second direction to set a bias point of each qubit of the corresponding sub-array of qubits in the second direction between a first position, in which the qubit is unenabled and not responsive to the control signal, and a second position, in which the qubit is enabled and responsive to the control signal.

According to an exemplary embodiment of the present invention, a method of controlling a qubit array includes generating a first signal to set a bias point of a plurality of qubits to a first positions in which each qubit is unenabled and not responsive to a control signal, generating a second signal to move the bias point of selected qubits from the first position to a second position, in which each selected qubit is enabled and responsive to the control signal, and generating a control signal to control operation of the selected qubits.

According to an exemplary embodiment of the present invention, a method of controlling a qubit array includes dividing a number of physical qubits into logical blocks, wherein each logical block includes a plurality of physical qubits, applying a first signal to one or more logical blocks to set a bias point of each physical qubit to a first position, in which the physical qubit is unenabled and not responsive to a control signal, applying a second signal to one or more logical blocks to move the bias point of each physical qubit that is in the first position to a second position, in which the physical qubit is unenabled and not responsive to the control signal, applying a third signal to one or more logical blocks to move the bias point of each physical qubit that is in the second position to the third position, in which the physical qubit is enabled and responsive to the control signal, and applying the control signal to one or more logical blocks, in which the bias point of each physical qubit is in the first, second or third position, to control an operation of one or more logical blocks in which the bias point of each physical qubit is in the third position.

The present invention will become readily apparent to those of ordinary skill in the art when descriptions of exemplary embodiments thereof are read with reference to the accompanying drawings.

DESCRIPTION OF EXEMPLARY EMBODIMENTS

Hereinafter, exemplary embodiments of the present invention will be described with reference to the accompanying drawings. As used herein, the term "room temperature" refers to ambient or atmospheric temperature. In general, room temperature may be taken to be about 20° C. to about 25° C.

It is to be understood that exemplary embodiments of the present invention described herein may be implemented in various forms of hardware, software, firmware, special purpose processors, or a combination thereof. An exemplary embodiment of the present invention may take the form of an entirely hardware embodiment, an entirely software embodiment or an embodiment containing both hardware and software elements. An exemplary embodiment may be implemented in software as an application program tangibly embodied on one or more program storage devices, such as for example, computer hard disk drives, CD-ROM (compact disk-read only memory) drives and removable media such as CDs, DVDs (digital versatile discs or digital video discs), Universal Serial Bus (USB) drives, floppy disks, diskettes and tapes, readable by a machine capable of executing the program of instructions, such as a computer. The application program may be uploaded to, and executed by, an instruction execution system, apparatus or device comprising any suitable architecture. It is to be further understood that since exemplary embodiments of the present invention depicted in the accompanying drawing figures may be implemented in software, the actual connections between the system components (or the flow of the process steps) may differ depending upon the manner in which the application is programmed.

Figure 1:
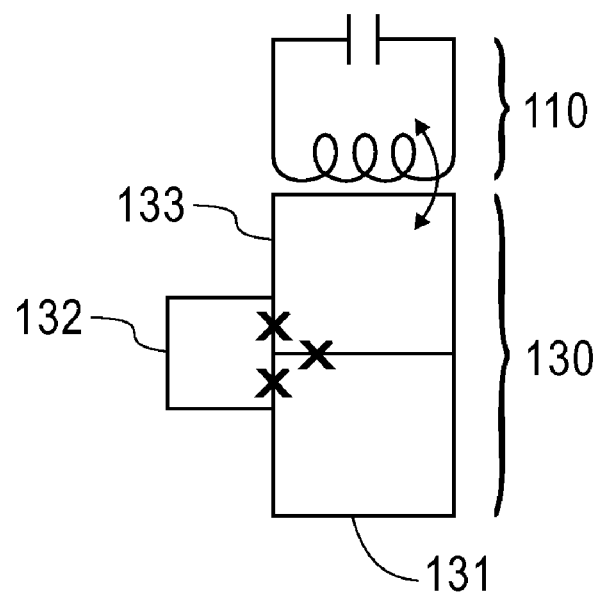
FIG. 1 is a block diagram illustrating a Josephson-junction-based qubit, according to an exemplary embodiment of the present invention.

FIG. 1 is a block diagram illustrating a Josephson-junction-based qubit, according to an exemplary embodiment of the present invention. Referring to FIG. 1, the Josephson-junction-based qubit 130 consists of three thin wire loops 131, 132, 133 connected as shown and three Josephson junctions, indicated by the X's, with two in each loop. A Josephson-junction-based qubit 130 may be, for example, about 400 μm by about 800 μm in size. The qubit 130 may operate at about 20 mK.

In the Josephson-junction-based qubit 130 shown in FIG. 1, the upper large loop 133 of the qubit 130 is coupled to an LC oscillator circuit 110, which allows the quantum information in the qubit 130 to be transferred reversibly between the three loops 131, 132, 133 and the LC circuit 110. The LC circuit 110 may be implemented using a superconducting transmission line, for example.

When the quantum information is located in the LC circuit 110, according to an exemplary embodiment of the present invention, the operating frequency system is independent of the control parameters. This will be discussed later in this disclosure with reference to FIGS. 3-5. Two control lines may be employed to operate the Josephson-junction-based qubit 130 shown in FIG. 1. For example, a cflux line 212 and a flux line 232, as shown of FIG. 2, can be used to operate a Josephson-junction-based qubit 130.

Figure 2:
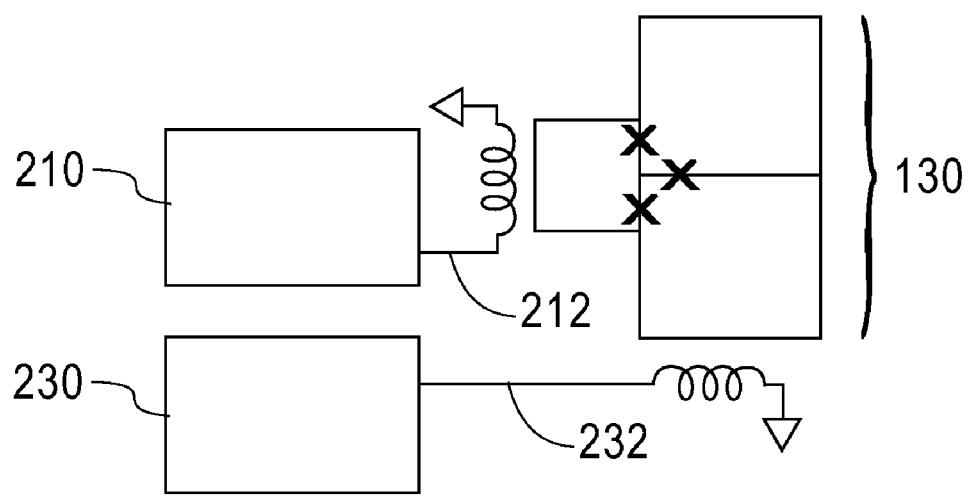
FIG. 2 is a block diagram illustrating a qubit circuit layout, according to an exemplary embodiment of the present invention.

FIG. 2 is a block diagram illustrating a qubit circuit layout, according to an exemplary embodiment of the present invention. Referring to FIG. 2, the control signals in the cflux line 212 and the flux line 232 are inductively coupled to the qubit 130. Depending on the nature of the desired quantum operation, the control signals may consist of DC, short duration pulses or pulsed microwaves, for example. The flux control signal source 230 and cflux control signal source 210 may be at room temperature.

Figure 6:
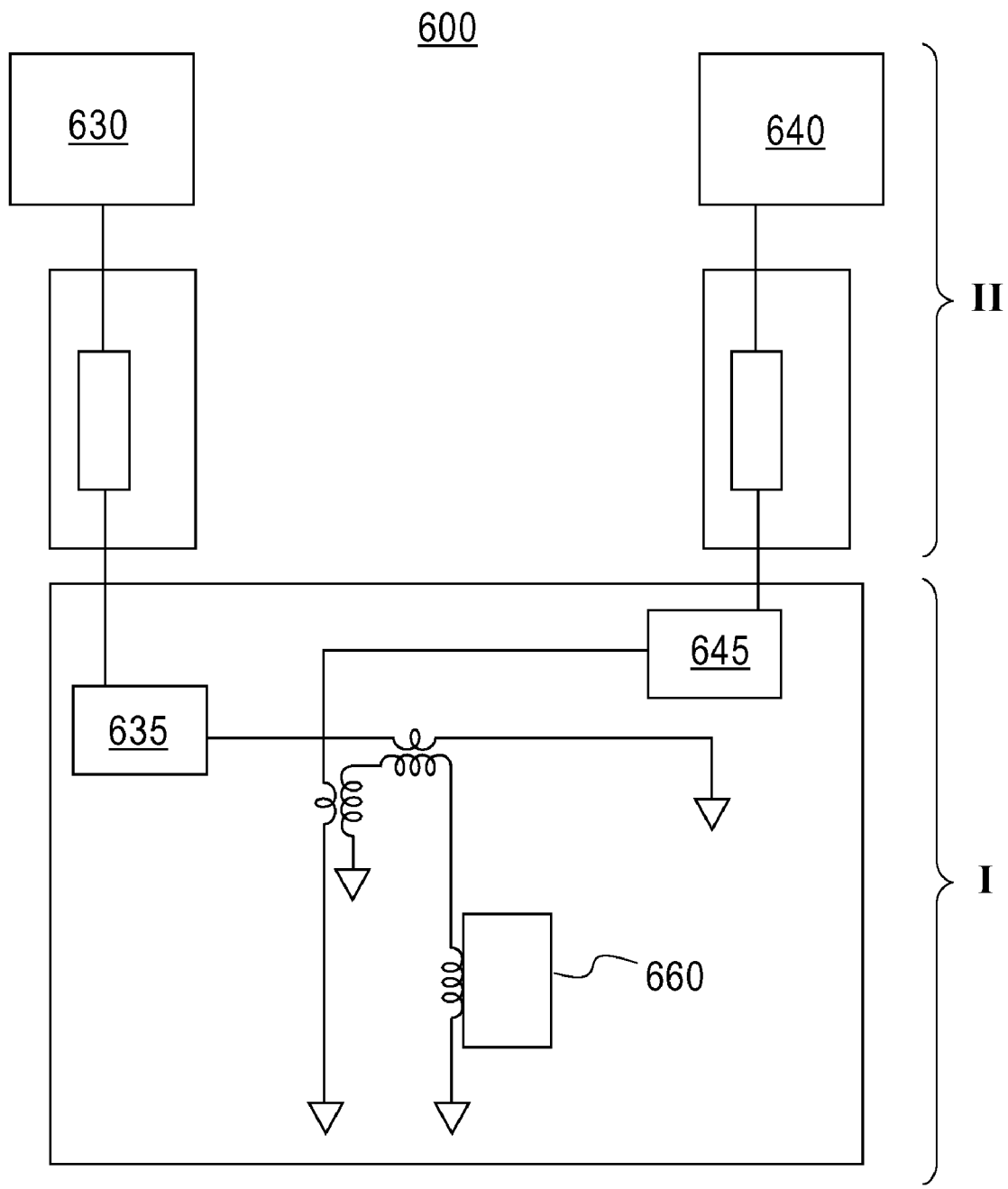
FIG. 6 is a block diagram illustrating a control system architecture for quantum computing, according to an exemplary embodiment of the present invention.

FIG. 6 is a block diagram illustrating a control system architecture for quantum computing, according to an exemplary embodiment of the present invention. Referring to FIG. 6, the control system architecture 600 includes a first qubit 660, a first signal source 630 and a second signal source 640. Although one qubit 660 and two corresponding signal sources are shown in FIG. 6, it is to be understood that any number of qubits and signal sources may be employed. A first filter 635 and a second filter 645 may be provided, for example. The filter and second filters 635 and 645 may comprise one or more signal filters to attenuate and filter noise.

Figure 3:
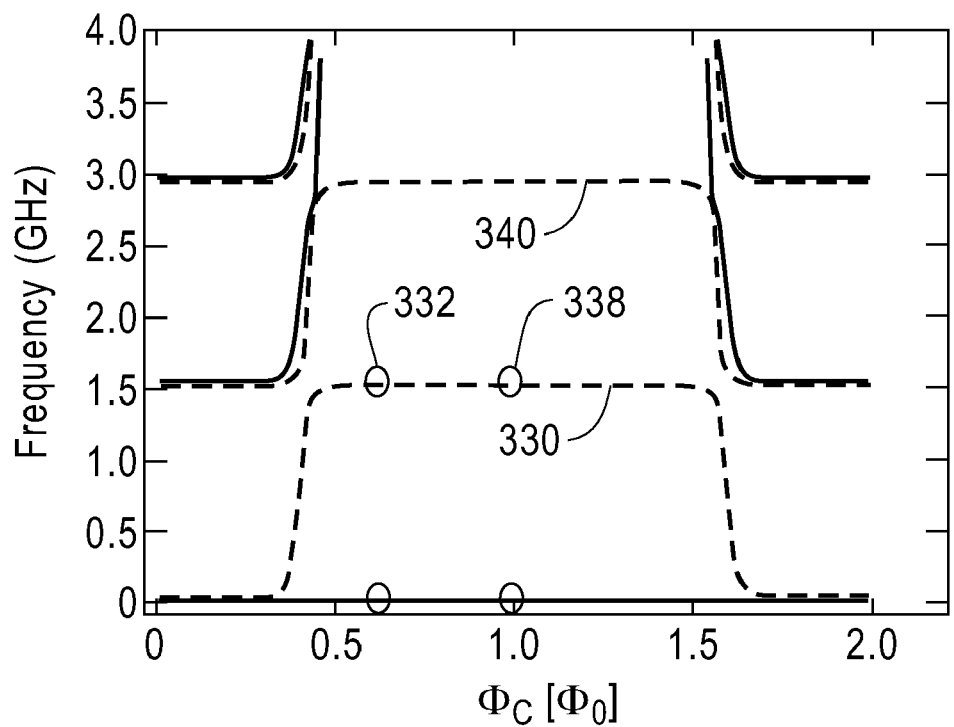
FIG. 3 is a graph for illustrating example positions of a bias point of a qubit, according to an exemplary embodiment of the present invention.
Figure 4:
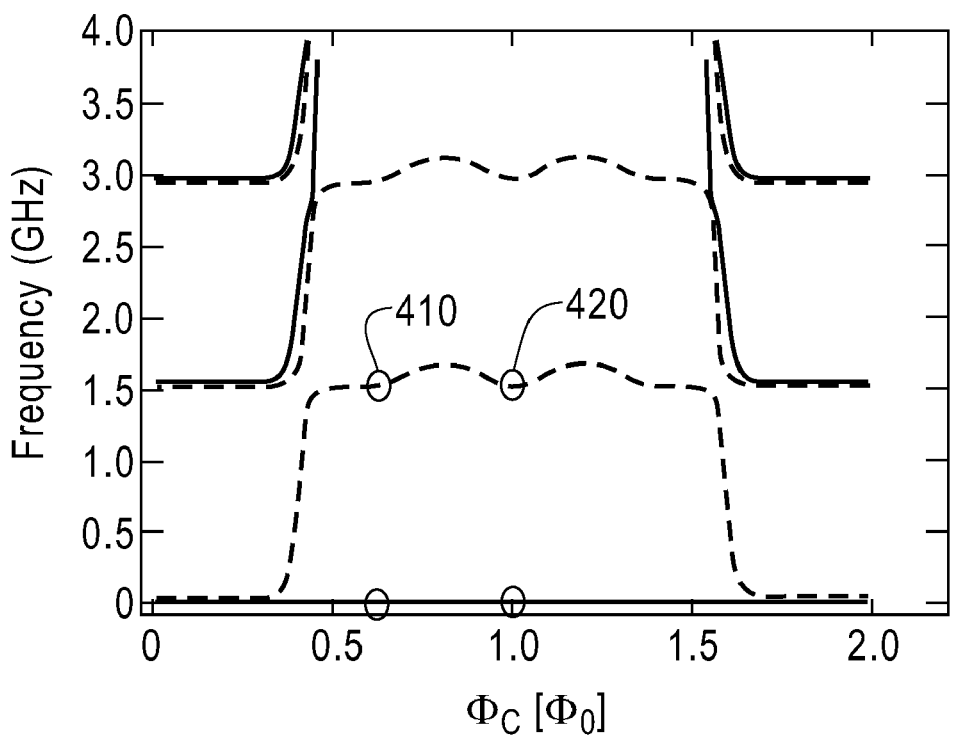
FIG. 4 is a graph for illustrating example positions of a bias point of a qubit, according to an exemplary embodiment of the present invention.
Figure 5:
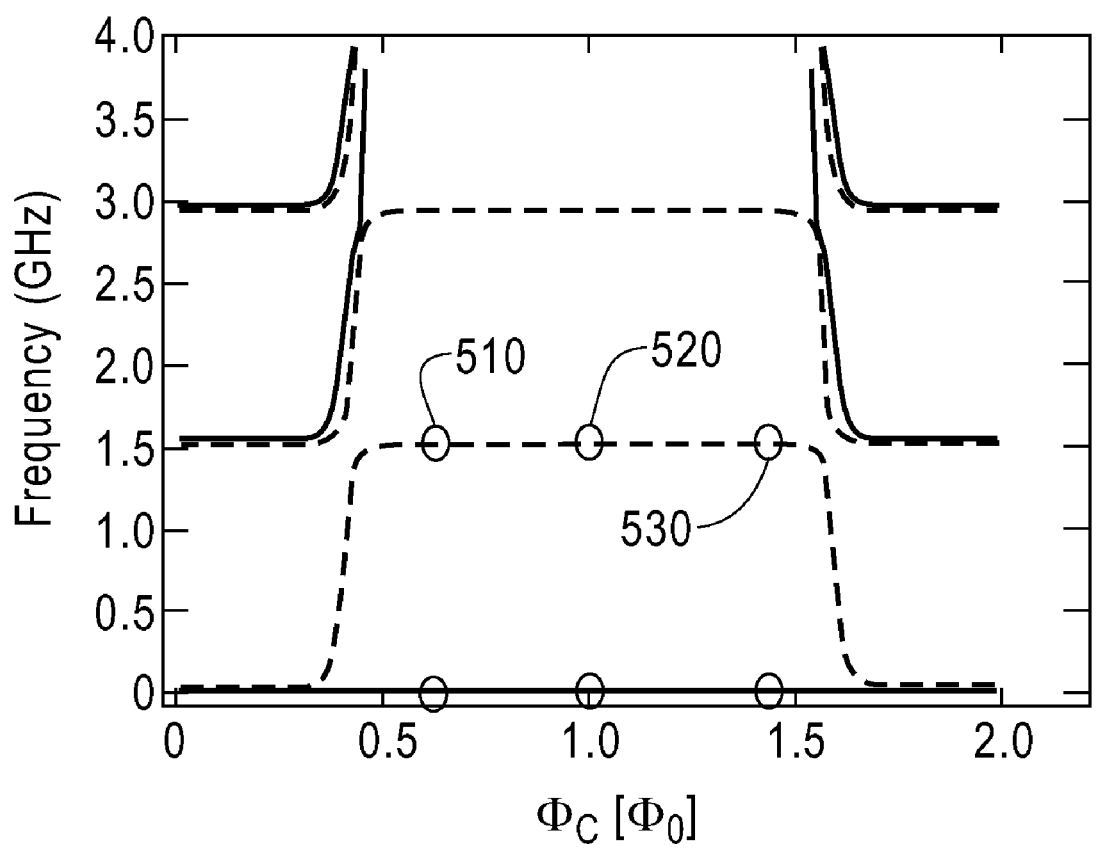
FIG. 5 is a graph for illustrating example positions of a bias point of a qubit, according to an exemplary embodiment of the present invention.

The first signal source 630, which is electrically coupled to the qubit 660, generates control signals to control operation of the qubit 660. A control signal may be an electrical current, a voltage, or any other signal. The bias point of the qubit 660 may be set using the second signal source 640. Example positions of a bias point of a qubit, according to exemplary embodiments of the present invention, are shown in FIGS. 3-5. The first signal source 630 and/or the second signal source 640 may be a superconducting SFQ circuit.

The qubit 660 may operate in a first environment I having a first temperature range. The first temperature range may be, for example, about 5 mK to about 30 mK. The first and second signal sources 630 and 640 may operate in a second environment II having a second temperature range. For example, the second temperature range may be about 20° C. to about 25° C. In an exemplary embodiment of the present invention, a system for quantum computing includes a plurality of qubits and a control system for controlling the qubits. A qubit may comprise, for example, quantum dots, electron and nuclear spins, or Josephson junctions. The qubits may be superconducting qubits. Signals from two types of signal sources may be combined to operate a qubit.

The first type of signal source may be, for example, a signal source operating in a room-temperature environment (also referred to herein as a "room-temperature signal source"). Examples of a room-temperature signal source include a precision current source, a precision current source that provides continuously variable current, current or voltage pulse sources, a frequency adjustable microwave current or voltage source, e.g., with the ability to shape the pulse in frequency and amplitude, and any adjustable current source that is capable of supplying about 1 µA (micro Ampere) to about 1000 µA operating in a room-temperature environment. In an exemplary embodiment of the present invention, the first type of signal source is a precision current source that provides continuously variable current that may vary from about 1 nA (nano Ampere) to about 10 mA (milli Ampere).

The second type of signal source may be, for example, a cryogenic current source, such as a low-power cryogenic current source. Various different low-power cryogenic current sources that provide stable, reliable, low-power current may be suitable for implementing the second type of signal source. The second type of signal source may have limited variably. In an exemplary embodiment of the present invention, the second type of signal source is a low-power cryogenic current source using SFQ (Single Flux Quantum) circuits capable of providing precise current pulses that vary from about 1 µA to about 1 mA.

In an exemplary embodiment of the present invention, any qubit that should have a gate applied would be required to satisfy two independent addressing conditions. For example, a control system architecture may include a control signal source and an enable signal source. In FIG. 6, for example, the first signal source 630 may be a control signal source and the second signal source 640 may be an enable signal source.

In an exemplary embodiment of the present invention, any qubit that should have a gate applied would be required to satisfy three independent addressing conditions. For example, a control system architecture may include a control signal source, an enable/unenable signal source and a second enable/unenable signal source. Such an example will be discussed later in this disclosure with reference to FIG. 8. It is to be understood that various numbers of independent addressing conditions may need to be satisfied and various numbers of signal sources may be employed.

FIG. 3 is a graph for illustrating example positions of a bias point of a qubit, according to an exemplary embodiment of the present invention. FIG. 3 shows the measured frequency (GHz) versus control flux, which is denoted by $\Phi_C[\Phi_0]$. Referring to FIG. 3, two examples of a qubit operating characteristic curve 330 and 340 are shown. In a quantum system, information processing may require that each qubit is biased at a "bias position" 332, as depicted in FIG. 3. If a cflux control line pulse is applied to a qubit array, according to an exemplary embodiment of the present invention, any qubit biased at the bias position 332 will execute a gate, depending on the magnitude and duration of the cflux control line pulse and the value of the applied flux to the qubit. The timing and precision of the cflux control pulse, for example, may be controlled using a room-temperature source of the control line cflux pulse.

In an exemplary embodiment of the present invention, a select/deselect signal source provides a select/deselect signal to move a qubit bias point from the bias position 332 to a "deselect position" 338, as shown in FIG. 3. When a qubit is biased at the deselect position 338, the application of the cflux control line pulse to move the bias point to the bias position 332 will not change the state of the qubit. That is, over the range in cflux from the deselect position 338 to the bias position 332 the qubit eigenfrequency, i.e., the operating frequency, is unchanged.

To minimize the room-temperature-to-30-mK connections, one cflux control line may be connected to many qubits. However, in operation of "logical qubits", during any one cflux pulse, only a fraction of the qubits may be required to operate. A "logical qubit" may be composed of a main qubit and a plurality of error-correction qubits. Qubits not required for a computation may be biased at the "deselected position", and qubits that are required to operate may be biased at the "bias position".

The bias point may be set using a plurality of select/deselect signal sources each coupled to a corresponding one of the qubits. In an exemplary embodiment of the present invention, each select/deselect signal source independently operates to set a bias point of the corresponding qubit between a first position, in which the qubit is unenabled and not responsive to the control signals, and a second position, in which the qubit is enabled and is responsive to the control signals.

The magnitude and duration of the cflux control pulses may be continuously variable. In an exemplary embodiment of the present invention, the rise and fall times of the cflux control pulses are controlled and have values on the order of 1 ns (nanosecond).

The requirements for the select/deselect signal source may differ from those for cflux control pulses. The rise and fall times of a select/deselect current pulse may be relatively long and the magnitude and duration of the select/deselect pulses may be quantized. However, the magnitude and duration of the select/deselect pulses do not need to be continuously variable.

The select/deselect signal source may be realized by an SFQ (Single Flux Quantum) based current source. For example the SFQ-based current source may provide a quantized current with a rise time of 10 ns by applying 100 flux quanta into a loop in 10 ns. Where the inductance value is 1 nH, for example, the SFQ current source may provide a select/deselect current of 200 μA. The SFQ-based source may be constructed on a chip or chips other than the qubit chip, whereby the heat generated by the SQF pulses would not warm the qubit chip. The connection between the SFQ-based source and the qubit chip may be filtered, which may help to reduce the interference between the qubit and the SFQ circuits. A filter may comprise one or more signal filters to attenuate and filter noise.

In an exemplary embodiment of the present invention, a system for quantum computing includes a plurality of qubits and a control system for controlling the qubits. For example, the qubits may comprise quantum dots, electron and nuclear spins, or Josephson junctions. The qubits may be superconducting qubits. The control system, according to an exemplary embodiment of the present invention, generates control signals to control operation of the qubits and sets a bias point of each qubit between a first position, in which the qubit is unenabled and not responsive to the control signals, and a second position, in which the qubit is enabled and responsive to the control signals. A control signal may be an electrical current, a voltage, or any other signal.

In an exemplary embodiment of the present invention, a control system for controlling a plurality of qubits includes a control signal source, commonly coupled to each qubit, and a plurality of select/deselect signal sources each coupled to a corresponding one of the qubits. The control signal source commonly coupled to each qubit generates control signals to control operation of the qubits. Each select/deselect signal source independently operates to set a bias point of the corresponding qubit between a first position, in which the qubit is unenabled and not responsive to the control signals, and a second position, in which the qubit is enabled and is responsive to the control signals.

FIG. 4 is a graph for illustrating example positions of a bias point of a qubit, according to an exemplary embodiment of the present invention. FIG. 4 shows the measured frequency (GHz) versus control flux, which is denoted by $\Phi_C[\Phi_0]$. FIG. 4 illustrates the case where the operating frequency of a qubit is not independent of bias over a large range, but because of the physical makeup of the qubit, satisfies the weaker condition that the frequency is only identical at two points.

In the simpler case of FIG. 3, any qubit that makes the transit from the unenabled point to the bias point is unaffected since the operating frequency is substantially the same before, during, and after the transit. For the example qubit depicted in FIG. 4, the operating frequency before and after the transit from the deselect point 420 to the bias point 410 will be substantially the same, but during the transit there will be some change in the state of the qubit since the frequency changes for the depicted qubit. The process of operating multiple qubits that have operating characteristics shown in FIG. 4 may require that a record be kept of the number of transits for each qubit and/or may require corrections to be applied. However, the additional complexity required on the system level may be minimal compared to the flexibility achieved in being able to select and deselect qubits for operation that have operating characteristics shown in FIG. 4.

FIG. 5 is a graph for illustrating example positions of a bias point of a qubit, according to an exemplary embodiment of the present invention. FIG. 5 shows the measured frequency (GHz) versus control flux, which is denoted by $\Phi_C[\Phi_0]$. FIG. 5 demonstrates that if a qubit has an operating frequency that is independent of the control parameter (the x-axis variable) over a large range, then multiple deselected positions may be used. For example, the qubit may be biased at the "unenabled position" or at the "second possible unenabled position" without changing the time evolution of the qubit information.

Figure 7:
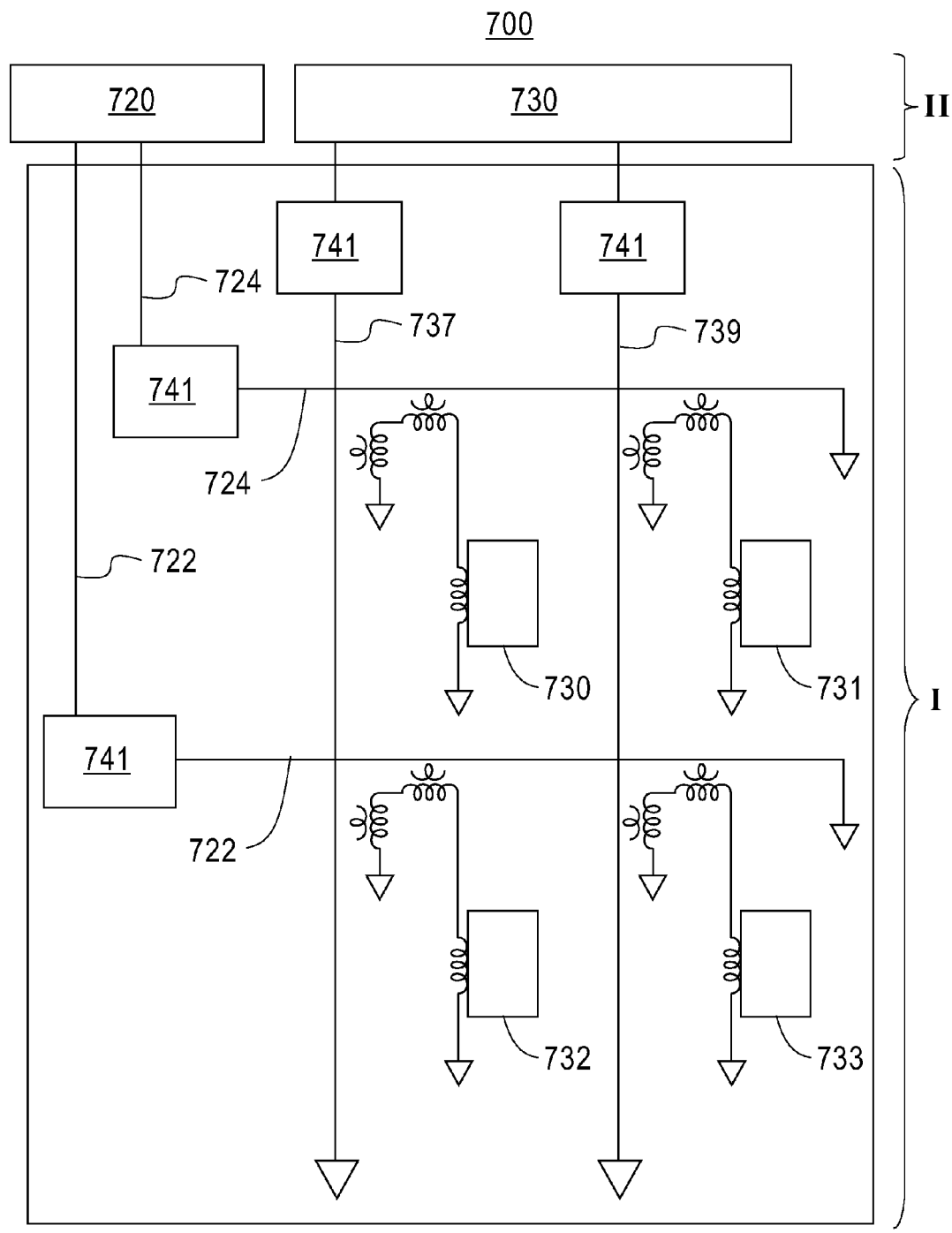
FIG. 7 is a block diagram illustrating a control system architecture for quantum computing, according to an exemplary embodiment of the present invention.

FIG. 7 is a block diagram illustrating a control system architecture for quantum computing, according to an exemplary embodiment of the present invention. Referring to FIG. 7, the control system architecture 700 includes an array of qubits 730, 731, 732 and 733, which may be divided into a plurality of sub-arrays based on a first direction and a second direction, wherein the second direction intersects the first direction. The qubits may comprise, for example, quantum dots, electron and nuclear spins, or Josephson junctions. The qubits may be a superconducting qubits.

The control system architecture 700 includes two control lines 722 and 724, which are coupled to sub-arrays of qubits in the first direction, two enable/unenable lines 737 and 739, which are coupled to sub-arrays of qubits in the second direction, a control signal source 720 and an enable/unenable signal source 730. Although four qubits 730, 731, 732 and 733, two control lines 722 and 724 and two enable/unenable lines 737 and 739 are shown in FIG. 7, it is to be understood that any number of qubits and signal lines may be employed.

The qubits 730, 731, 732 and 733 may operate in a first environment I having a first temperature range. The first temperature range may be, for example, about 5 mK to about 30 mK. The control signal source 720 and the enable/unenable signal source 730 may operate in a second environment II having a second temperature range. The second temperature range may be, for example, about 20° C. to about 25° C.

The enable/unenable signal source 730 generates an enable signal. A number of enable/unenable lines (e.g., lines 737 and 739) may be used to apply the enable signal independently to the corresponding sub-array of qubits in the second direction to set a bias point of each qubit of the corresponding sub-array of qubits in the second direction between a first position, in which the qubit is unenabled and not responsive to the control signal, and a second position, in which the qubit is enabled and responsive to the control signal.

The control signal source 720 generates a control signal. A number of control lines (e.g., lines 722 and 724) are used to apply the control signal commonly to one or more sub-arrays of qubits in the first direction.

The control signal source 720 and/or enable/unenable signal source 730 may be implemented using superconducting SFQ logic. It is to be understood that control signal source 720 and/or enable/unenable signal source 730 may be embodied in many different forms or configurations.

In an exemplary embodiment of the present invention, an SFQ-based enable/unenable signal source functions as a current source to precisely move the operating point of the qubit, for example, from the "deselect position" 338 to the "bias position" 332 shown in FIG. 3. The enable/unenable signal source 730 may be employed to move the operating point of the qubit between an "unenabled position" 520 and an "enabled position" 510 and/or to other possible operating point(s) of the qubit, such as a second unenabled position 530, as shown in FIG. 5.

Although not shown as such in FIG. 7, the control system architecture 700 may further include additional enable/unenable lines each coupled to a corresponding sub-array of qubits in the second direction. An additional enable/unenable signal source (not shown) may be provided that generates a enable signal, wherein the enable/unenable lines are used to apply the enable signal independently to the corresponding sub-array of qubits in the second direction to move the bias point of each qubit of the corresponding sub-array of qubits in the second direction from a third position, in which the qubit is unenabled and not responsive to the control signal, to the first position, wherein the first position is between the second position and the third position.

Figure 8:
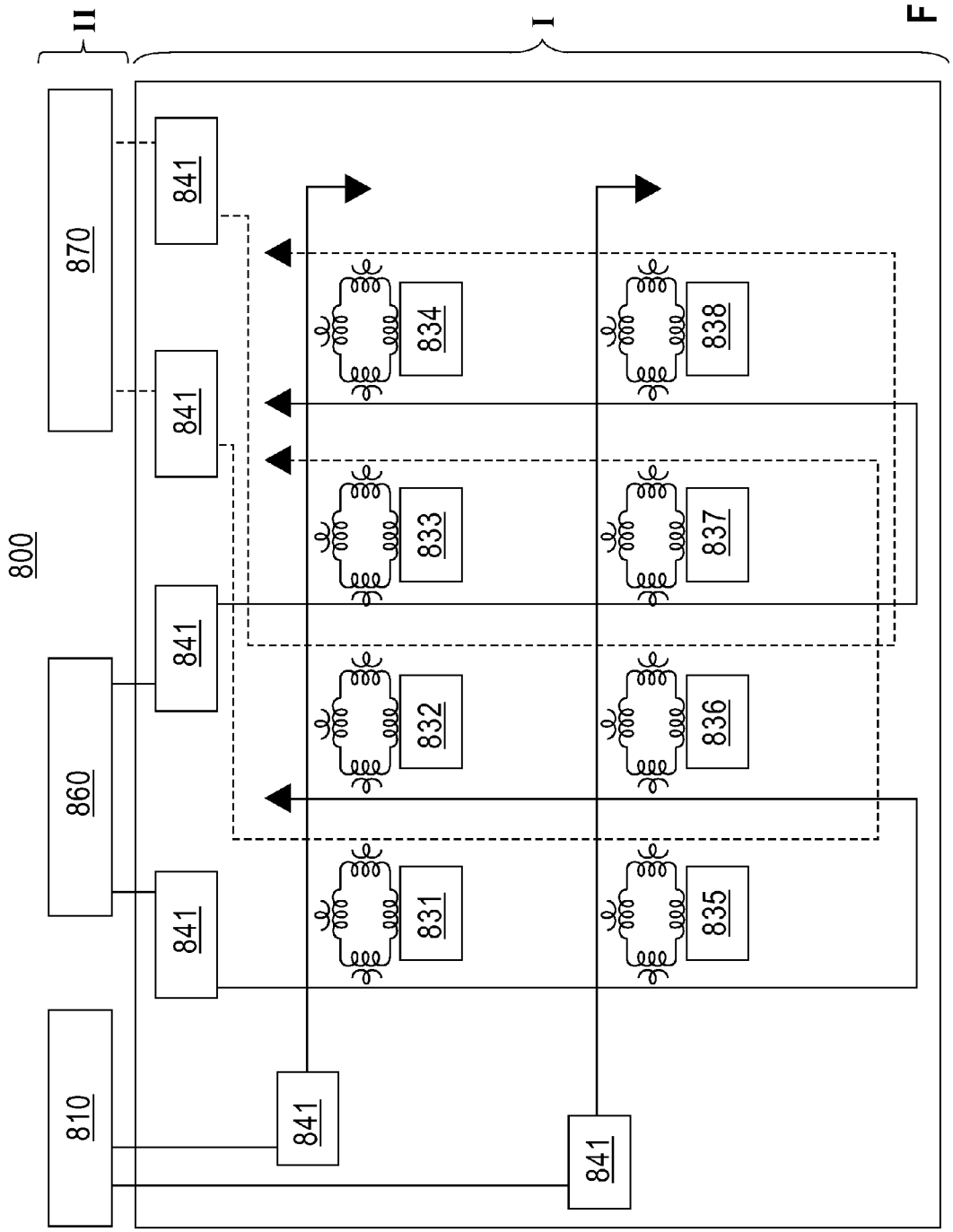
FIG. 8 is a block diagram illustrating a control system architecture for quantum computing, according to an exemplary embodiment of the present invention.

FIG. 8 is a block diagram illustrating a control system architecture for quantum computing, according to an exemplary embodiment of the present invention. In the control system architecture 800, operation of any one qubit requires the simultaneous application of two enable/unenable signals, which may be provided by two enable/unenable sources 860 and 870, and a control signal, which may be provided by a control signal source 810. The corresponding control bias versus qubit operating frequency is shown in FIG. 5. FIG. 7 shows a two-dimensional layout of qubits addressable using a single enable/unenable source 730 and control source 720. The example of FIG. 8 adds a second layer of the two-dimensional array that can conveniently be imagined to exist in a third direction coming out of the plane of the page.

Although FIG. 8 depicts two qubits in each of three "perpendicular" directions for a total of eight qubits 831, 832, 833, 834, 835, 836, 837 and 838, it is to be understood that the control system architecture 800 can be implemented having any number of qubits in each direction. Using this topological analogy and additional enable/unenable sources, the logical layout can be expanded beyond 3 dimensions, for example, to 4 or even higher dimensions. The design of a configuration of enable/unenable sources that are attached to each qubit will depend very much on the layout of the logical qubit. It is to be understood that the layouts depicted in FIGS. 6, 7 and 8 may be replaced by a more complex arrangement of enable/unenable and control lines that are chosen to represent the temporal flow of information and/or error correction of the logical qubits.

The qubits 831, 832, 833, 834, 835, 836, 837 and 838 may operate in a first environment I having a first temperature range. For example, the first temperature range may be about 5 mK to about 30 mK. The control signal source 810 and the two enable/unenable sources 860 and 870 may operate in a second environment II having a second temperature range. The second temperature range may be, for example, about 20° C. to about 25° C.

In FIGS. 6, 7 and 8 the terminations of all lines are shown going to ground at the lowest temperature. For reasons of signal fidelity, many or all these lines may have to be terminated using a load having the characteristic impedance of the line, such as for example, 50 Ohms, without the generation of much excess heat. These two conflicting requirements may require the lines to be terminated at a higher temperature stage than the qubit operation temperature.

Also shown in FIGS. 6, 7 and 8 are various filters, for example, the two filters 635 and 645 shown in FIG. 7 or the six filters 841 shown in FIG. 8. Since the control and enable/unenable sources typically operate at temperatures higher than the qubit operating temperature, various filters may be used to prevent noise, such as thermal noise or other noise (e.g., generated by the control or enable/unenable sources), from impinging on the qubits and causing excess decoherence.

In an exemplary embodiment of the present invention, the control signal source operates in a first environment having a first temperature range, the enable/unenable signal source operates in a second environment having a second temperature range, and the qubits operate in a third environment having a third temperature range. For example, the first temperature range may be substantially equal to the second temperature range, and the third temperature range may be about 5 mK to about 30 mK.

Figure 9:
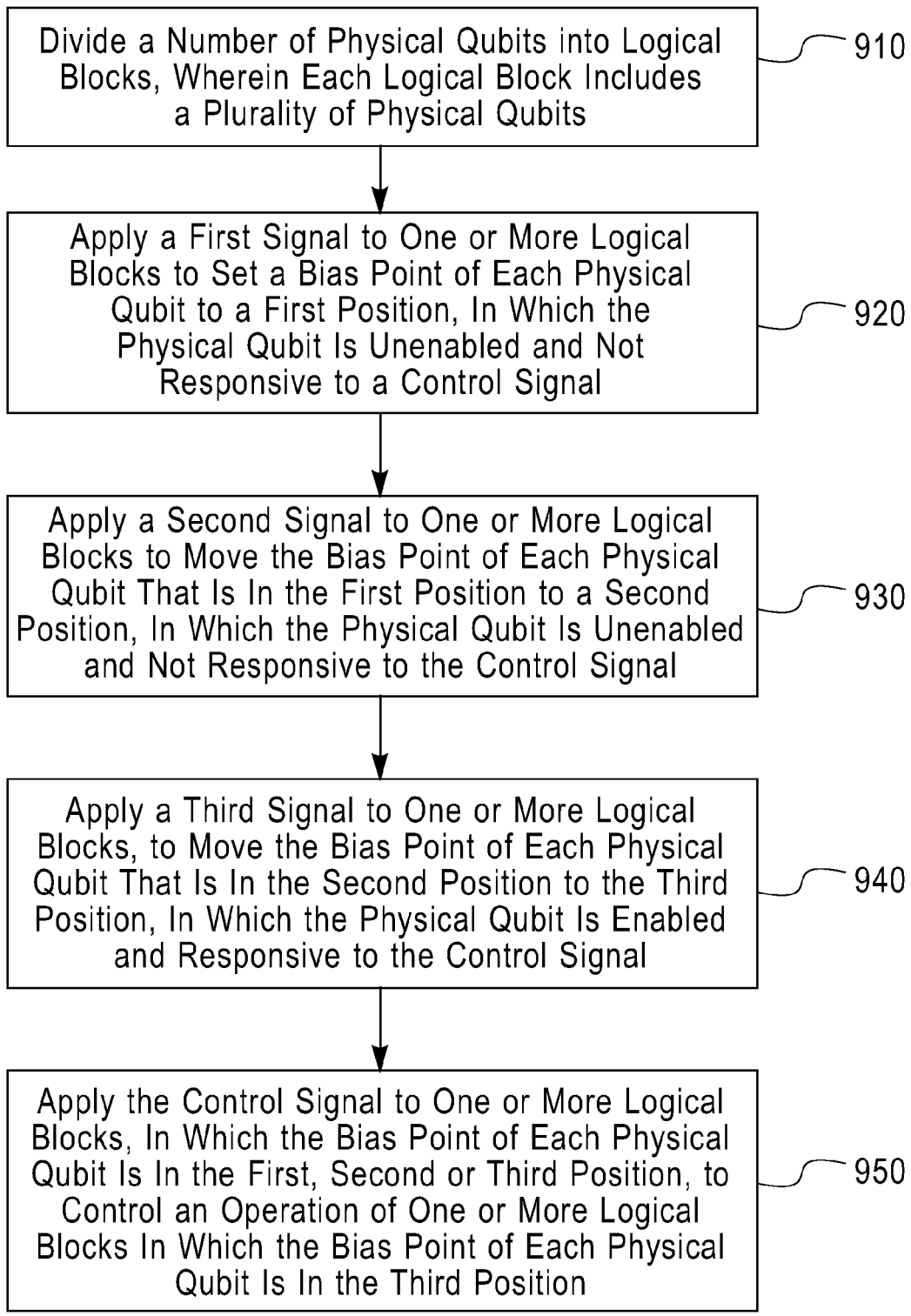
FIG. 9 is a flowchart illustrating a method of controlling a qubit array, according to an exemplary embodiment of the present invention.

FIG. 9 is a flowchart illustrating a method of controlling a qubit array, according to an exemplary embodiment of the present invention. Referring to FIG. 9, in step 910, divide a number of physical qubits into logical blocks, wherein each logical block includes a plurality of physical qubits. For example, the qubits may comprise quantum dots, electron and nuclear spins, or Josephson junctions. The qubits may be a superconducting qubits.

In step 920, apply a first signal to one or more logical blocks to set a bias point of each physical qubit to a first position, in which the physical qubit is unenabled and not responsive to a control signal. The first signal may be an electrical current, a voltage, or any other signal. In an exemplary embodiment of the present invention, the bias point is a current bias point and the first signal is an electrical current. Setting the bias point of each physical qubit to the first position may include using a first signal source. The first signal source may be, for example, a superconducting SFQ circuit.

In step 930, apply a second signal to one or more logical blocks to move the bias point of each physical qubit that is in the first position to a second position, in which the physical qubit is unenabled and not responsive to the control signal. The second signal may be an electrical current, a voltage, or any other signal.

In step 940, apply a third signal to one or more logical blocks to move the bias point of each physical qubit that is in the second position to the third position, in which the physical qubit is enabled and responsive to the control signal. The third signal may be an electrical current, a voltage, or any other signal.

In step 950, apply the control signal to one or more logical blocks, in which the bias point of each physical qubit is in the first, second or third position, to control an operation of one or more logical blocks in which the bias point of each physical qubit is in the third position. In an exemplary embodiment of the present invention, the control signal is applied commonly to a number of logical blocks to perform an operation, wherein only the physical qubits for which the bias point is in the third position are triggered to perform the operation. The control signal may be an electrical current, a voltage, or any other signal. The control signal may be applied using a superconducting SFQ circuit.

In an exemplary embodiment of the present invention, the qubits operate in a first environment having a first temperature range, and the control signal is applied using a control signal source that operates in a second environment having a second temperature range. The first temperature range may be, for example, about 5 mK to about 30 mK. The second temperature range may be about 20° C. to about 25° C.

In an exemplary embodiment of the present invention, a method of controlling a qubit array includes generating a first signal to set a bias point of a plurality of qubits to a first position, in which each qubit is unenabled and not responsive to a control signal, generating a second signal to move the bias point of selected qubits from the first position to a second position, in which each selected qubit is enabled and responsive to the control signal, and generating a control signal to control operation of the selected qubits. The qubits may comprise quantum dots, electron and nuclear spins, or Josephson junctions, for example. The qubits may be a superconducting qubits. The signals for moving the bias point of qubits may be generated using a plurality of signal sources, which may be, for example, superconducting SFQ (Single Flux Quantum) circuits.

Although exemplary embodiments of the present invention have been described in detail with reference to the accompanying drawings for the purpose of illustration and description, it is to be understood that the inventive processes and apparatus are not to be construed as limited thereby. It will be apparent to those of ordinary skill in the art that various modifications to the foregoing exemplary embodiments may be made without departing from the scope of the invention as defined by the appended claims, with equivalents of the claims to be included therein.

What is claimed is:

1. A control system architecture for quantum computing, comprising:
    an array of qubits, which is divided into a plurality of sub-arrays based on a first direction and a second direction, the second direction intersecting the first direction;
    a plurality of control lines each coupled to a corresponding sub-array of qubits in the first direction;
    a plurality of enable/unenable lines each coupled to a corresponding sub-array of qubits in the second direction;
    a control signal source that generates a control signals, wherein the control lines are used to apply the control signal commonly to one or more sub-arrays of qubits in the first direction;
    an enable/unenable signal source that generates a enable signal, wherein the enable/unenable lines are used to apply the enable signal independently to the corresponding sub-array of qubits in the second direction to set a bias point of each qubit of the corresponding sub-array of qubits in the second direction between a first position, in which the qubit is unenabled and not responsive to the control signal, and a second position, in which the qubit is enabled and responsive to the control signal.

2. The control system architecture of claim 1, wherein the qubits comprise Josephson junctions.

3. The control system architecture of claim 1, wherein the qubits comprise electron and nuclear spins.

4. The control system architecture of claim 1, wherein the qubits comprise quantum dots.

5. The control system architecture of claim 1, wherein the control signal source comprises a first superconducting SFQ (Single Flux Quantum) circuit.

6. The control system architecture of claim 5, wherein the enable/unenable signal source comprises a second superconducting SFQ circuit.

7. The control system architecture of claim 1, wherein the control signal source operates in a first environment having a first temperature range, the enable/unenable signal source operates in a second environment having a second temperature range, and the qubits operate in a third environment having a third temperature range.

8. The control system architecture of claim 7, wherein the first temperature range is substantially equal to the second temperature range, and wherein the third temperature range is about 5 mK to about 30 mK.

9. The control system architecture of claim 1, further comprising a plurality of enable/unenable lines each coupled to a corresponding sub-array of qubits in the second direction.

10. The control system architecture of claim 9, further comprising a enable/unenable signal source that generates a enable signal, wherein the enable/unenable lines are used to apply the enable signal independently to the corresponding sub-array of qubits in the second direction to move the bias point of each qubit of the corresponding sub-array of qubits in the second direction from a third position, in which the qubit is unenabled and not responsive to the control signal, to the first position, wherein the first position is between the second position and the third position.

11. A program storage device readable by machine, tangibly embodying a program of instructions executable by the machine to perform method steps for controlling a qubit array, the method steps comprising:
    generating a first signal to set a bias point of a plurality of qubits to a first position, in which each qubit is unenabled and not responsive to a control signal;
    generating a second signal to move the bias point of selected qubits from the first position to a second position, in which each selected qubit is enabled and responsive to the control signal; and
    generating a control signal to control operation of the selected qubits.

12. The program storage device of claim 11, wherein the qubits comprise Josephson junctions.

13. The program storage device of claim 11, wherein the qubits comprise electron and nuclear spins.

14. The program storage device of claim 11, wherein the qubits comprise quantum dots.

15. The program storage device of claim 11, wherein the method steps further comprise applying the control signal commonly to the qubits to control operation of the selected qubits.

16. A method of controlling a qubit array comprising:
    dividing a number of physical qubits into logical blocks, wherein each logical block includes a plurality of physical qubits;
    applying a first signal to one or more logical blocks to set a bias point of each physical qubit to a first position, in which the physical qubit is unenabled and not responsive to a control signal;
    applying a second signal to one or more logical blocks to move the bias point of each physical qubit that is in the first position to a second position, in which the physical qubit is unenabled and not responsive to the control signal;
    applying a third signal to one or more logical blocks to move the bias point of each physical qubit that is in the second position to the third position, in which the physical qubit is enabled and responsive to the control signal; and
    applying the control signal to one or more logical blocks, in which the bias point of each physical qubit is in the first, second or third position, to control an operation of one or more logical blocks in which the bias point of each physical qubit is in the third position.

17. The method of claim 16, wherein the second position is between the first position and a third position.

18. The method of claim 16, wherein the qubits comprise Josephson junctions.

19. The method of claim 16, wherein the qubits comprise electron and nuclear spins.

20. The method of claim 16, wherein the qubits comprise quantum dots.

* * * * *